(12) United States Patent
Travis et al.

(10) Patent No.: US 6,396,158 B1
(45) Date of Patent: May 28, 2002

(54) SEMICONDUCTOR DEVICE AND A PROCESS FOR DESIGNING A MASK

(75) Inventors: Edward O. Travis, Austin, TX (US); Aykut Dengi, Tempe, AZ (US); Sejal Chheda, Austin, TX (US); Tat-Kwan Yu, Austin, TX (US); Mark S. Roberton, Austin, TX (US); Ruiqi Tian, Pflugerville, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/340,697

(22) Filed: Jun. 29, 1999

(51) Int. Cl.$^7$ ............................................... H01L 23/48
(52) U.S. Cl. ...................... 257/784; 257/621; 257/752; 257/758
(58) Field of Search ................................ 257/750, 752, 257/758, 621, 638, 798, 797, 620, 784; 438/401, 462, 599, 637, 926

(56) References Cited

U.S. PATENT DOCUMENTS

| | | | |
|---|---|---|---|
| 5,278,105 A | | 1/1994 | Eden et al. ................... 437/250 |
| 5,386,088 A | | 1/1995 | Gardner ....................... 174/261 |
| 5,665,633 A | | 9/1997 | Meyer .......................... 438/427 |
| 5,747,380 A | * | 5/1998 | Yu et al. ...................... 438/599 |
| 5,885,856 A | | 3/1999 | Gilbert et al. ............... 438/129 |
| 5,923,563 A | * | 7/1999 | Lavin et al. ................. 364/488 |
| 5,948,573 A | * | 9/1999 | Takahashi ...................... 430/5 |
| 5,956,618 A | * | 9/1999 | Liu et al. ..................... 438/926 |
| 6,087,733 A | * | 7/2000 | Maxim et al. ............... 257/797 |

FOREIGN PATENT DOCUMENTS

| | | | |
|---|---|---|---|
| EP | 0 712 156 A2 | 5/1996 | ......... H01L/21/768 |
| EP | 0 825 644 A1 | 2/1998 | ......... H01L/21/762 |
| JP | 59-186342 | 10/1984 | ........... H01L/21/76 |
| JP | 10144635 A | 5/1998 | ......... H01L/21/304 |
| JP | 10293391 A | 11/1998 | ............. G03F/1/08 |
| JP | 11111718 A | 4/1999 | ....... H01L/21/3205 |
| JP | 11126822 A | 5/1999 | ........... H01L/21/82 |
| WO | WO 96/15552 | 5/1996 | ......... H01L/23/053 |

OTHER PUBLICATIONS

Andrew B. Kahng et al., "Filling and Slotting: Analysis and Algorithms", ISPD 98 Monterey CA USA, pp. 95–102.
Brian E. Stine et al., "The Physical and Electrical Effects of Metal–Fill Patterning Practices for Oxide Chemical–Mechanical Polishing Processes", 1998 IEEE, pp. 665–679.
B. Stine et al., "A Closed–Form Analytic Model for ILD Thickness Variation in CMP Processes", Proc. CMP–MIC, Santa Clara, CA, Feb. 1997.
Andrew B. Kahng et al., "Filling Algorithms and Analyses for Layout Density Control", 1999 IEEE, vol. 18, No. 4, Apr., 1999, pp. 445–462.
Stine et al, "The Physical and Electrical Effects of Metal –Fill Patterning Practices for Oxide Chemical–Mechanical Polishing Processes", IEEE Transactions on Electron Devices, vol. 45, No. 3, pp. 665–679 (1998).
Wei Huang, et al., "A Layout Advisor for Timing–Critical Bus Routing1", 1997 IEEE, pp. 210–214.
George Y. Liu et al., "Chip–Level CMP Modeling And Smart Dummy For HDP And Conformal CVD Films", Proceedings of CMP–MIC Feb. 11, 1999, (8 pages).
PCT International Search Report: PCT/US00/14293 (6 pp.).

* cited by examiner

Primary Examiner—Don Wong
Assistant Examiner—Hoang Nguyen
(74) Attorney, Agent, or Firm—George R. Meyer

(57) ABSTRACT

Selective placement of polishing dummy feature patterns, rather than indiscriminate placement of polishing dummy feature patterns, is used. Both low frequency (hundreds of microns and larger) and high frequency (10 microns and less) of topography changes are examined. The polishing dummy feature patterns can be specifically tailored to a semiconductor device and polishing conditions used in forming the semiconductor device. When designing an integrated circuit, polishing effects for the active features can be predicted. After polishing dummy feature pattern(s) are placed into the layout, the planarity can be examined on a local level (a portion but not all of the device) and a more global level (all of the device, devices corresponding to a reticle field, or even an entire wafer).

23 Claims, 8 Drawing Sheets

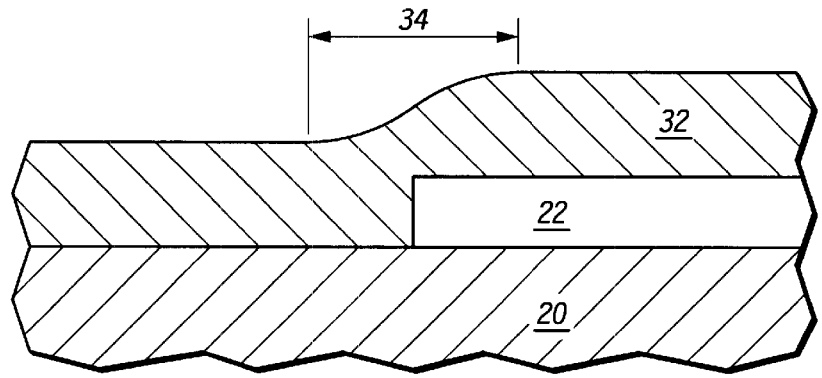
*FIG.4*
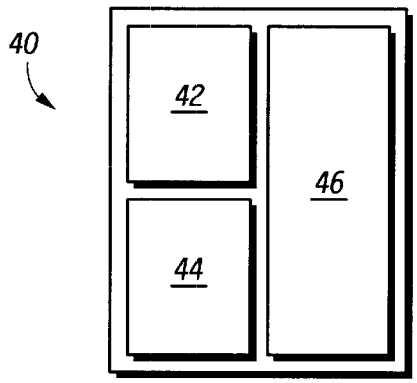
*FIG.5*
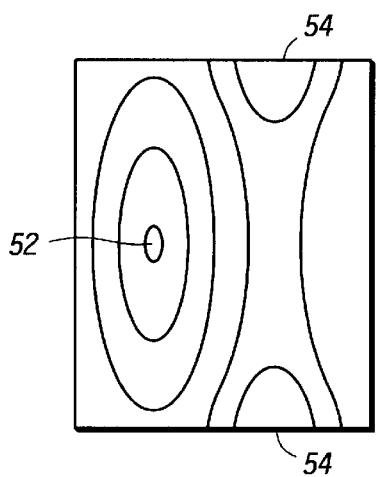 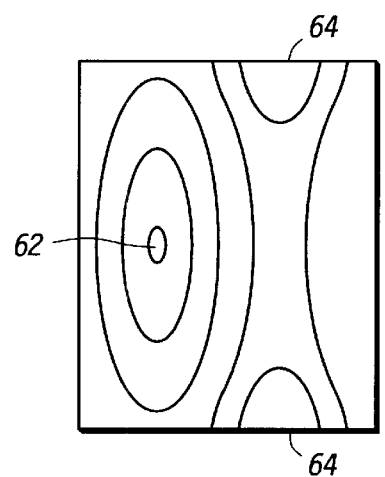
*FIG.6*   *FIG.7*

SEMICONDUCTOR DEVICE AND A PROCESS FOR DESIGNING A MASK

RELATED APPLICATION

This is related to U.S. patent application Ser. No. 09/191,353 filed Nov. 13, 1998, and entitled "Integrated Circuit and Method of Formation" and is incorporated herein by reference and assigned to the current assignee hereof.

FIELD OF THE INVENTION

This invention relates in general to semiconductor devices and masks, and more particularly, to semiconductor devices and masks having dummy features.

RELATED ART

Polishing is used to planarize surfaces in forming semiconductor devices. Traditionally, no tiling has been used in forming semiconductor devices. When no tiling is used, polishing causes dishing or other problems related to nonuniform thickness across a semiconductor device substrate. These problems include exceeding the depth of focus for lithography or etchrelated concerns that are illustrated in FIG. 1. FIG. 1 includes a substrate that includes a conductive layer 11. An insulating layer 12 is formed and patterned with openings extending to the conductive layer 11. A conductive fill material (e.g., tungsten or the like) is deposited into the openings and polished to form conductive plugs 13. The polishing can erode more of the insulating layer 12 where the conductive plugs are closely spaced. An insulating layer 16 is then formed over the conductive plugs 13. The upper surface of the insulating layer 16 is planar.

Openings 17 are then formed. In some locations, openings do not extend completely to all the conductive plugs 13 because of the erosion, thereby leaving an insulating gap 19 between an opening 17 and its underlying conductive plug 13 as shown in FIG. 1. An electrical open would be formed. If the etch is continued to remove gap 19, the conductive plugs 13 that are exposed earlier are overetched, typically resulting in high contact resistance. Therefore, the nonuniformity in thickness, caused in part by polishing, can result in electrical opens, high resistance contacts, electrical shorts, or other leakage paths.

Dummy features have been used as an attempt to solve the problems related to dishing and other accumulated thickness effects. Dummy features used to aid polishing are formed by "tiling" because, from a top view of the semiconductor device, the pattern of dummy features looks like tiles. The process for tiling typically includes creating a circuit layout, defining a buffer zone (typically in a range of approximately 5–10 microns) around active features within the layout, and combining the circuit layout with the minimum zone to determine excluded areas. All other areas are available for tiling.

Regardless of circuit density, tiling is used if the distance between any of active features is at or above a minimum width. Typically, the minimum width is no more than ten microns, and can be approximately ten microns. Tiles or at least partial tiles are placed in available areas at least five microns wide. The tiling pattern (i.e., size and density of tiles) is usually the same across a semiconductor device. See FIG. 5 in each of U.S. Pat. No. 5,278,105 and European Published Patent Application Number 0 712 156 (1996). Although portions of tiles are missing, the same feature density is used.

BRIEF DESCRIPTION OF THE DRAWINGS

The present invention is illustrated by way of example and not limitation in the accompanying figures, in which like references indicate similar elements, and in which:

FIG. 4 includes an illustration of a cross-sectional view of the substrate of FIG. 3 after depositing and polishing a layer overlying the patterned layer;

FIG. 5 includes an illustration of a top view of a semiconductor device;

FIG. 6 includes an illustration of a topographical representation of the semiconductor device of FIG. 5;

FIG. 7 includes an illustration of a complementary image of the topographical representation FIG. 6;

Figure 1:
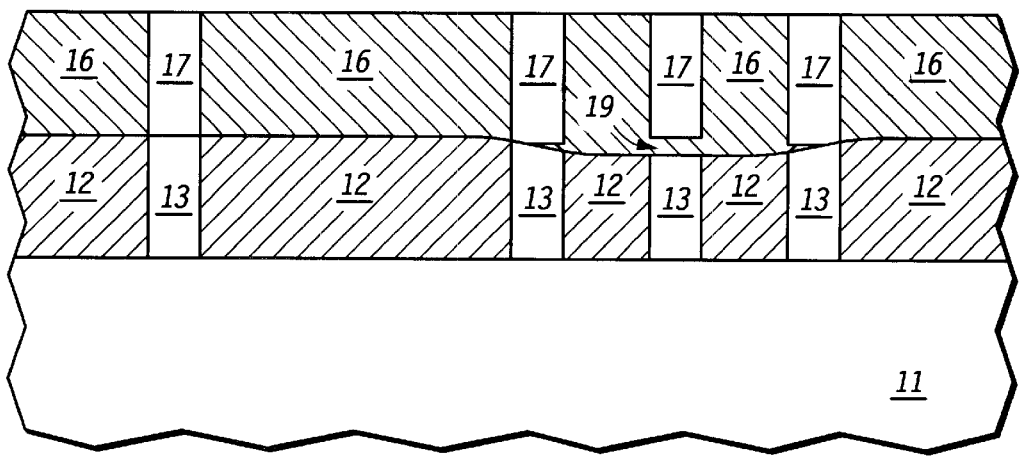
FIG. 1 includes an illustration of a cross-sectional view of a portion of a substrate after forming openings (prior art).

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Physical proximity effects, electrical proximity effects, or both are taken into account when determining where to place polishing dummy features. Polishing dummy features can be inserted, removed, moved, or otherwise modified at one or more feature level levels to achieve sufficient planarity without adversely affecting the performance of the semiconductor device. In essence, more selective placement of polishing dummy feature patterns, rather than somewhat indiscriminate placement of polishing dummy feature patterns, is used. Both low frequency (hundreds of microns and larger) and high frequency (10 microns and less) of topography changes are examined. When implemented to its greatest extent, embodiments of the present invention allow for sufficient planarity, while preserving signal integrity. The present invention is defined by the claims and is better understood after reading the rest of the detailed description.

A number of terms are defined below to aid in the understanding the specification.

1. Active features are features that correspond to the designed circuitry for a semiconductor device. The active features include portions of transistors, capacitors, resistors, or the like. Active features include power supply features, which are designed to operate at a substantially constant potential, and signal features, which are designed to operate at one potential under one set of electronic conditions and a different potential at another set of electronic conditions.

2. Control features are features that help control the processing of a substrate. Control features include alignment marks, structures for measuring dimensions of features ("CD bars"), electrical test structures, and the like. The control features are typically located within scribe lines between dice on a semiconductor device substrate.

3. Environmental protection features are features having a primary (most important) function of protecting a semiconductor device from postfabrication environmental conditions. An edge ring seal around the die is the most common and about the only example of an environmental protection device. The edge ring seal provides mobile ion protection during dicing and packaging operations.

4. Integrated circuit area is the portion of the die with the active features. Typically, the integrated circuit area is bounded by bond pads near the edge of the die.

5. Peripheral area is the portion of a die that lies between the integrated circuit area and the scribe lines. In many integrated circuits, the peripheral area is the portion of the die lying between the bond pads and the scribe line.

6. Resolution-assist features are sub-resolution features that assist in the resolution of active features that are to be printed onto a semiconductor device substrate. The resolution-assist features are present in a mask but are not printed as separate features onto a substrate. Phase shifters are examples of resolution-assist features. For the purposes of this specification, features added for optical proximity correction are considered resolution-assist features.

7. Dummy features include features printed onto a semiconductor device substrate, where the features are not any of the other types of features defined above. Different types of dummy features are used in semiconductor devices for various reasons. Dummy bit lines are used in memory arrays along the outermost edges to allow all the active bit lines in the array to be uniformly patterned. Unlike dummy bit lines, polishing dummy features are dummy features added at a feature level of a mask of a semiconductor device to improve polishing characteristics at the current or a subsequently formed level. A polishing dummy feature is not required for the proper operation of a device.

8. Electronic design rules are rules for minimum spacing, size of features, or overlap between features within an integrated circuit. The electronic design rules are determined in part by processing margins and device performance (immunity to latch up, leakage current, etc.)

9. Polishing dummy feature design rules are a subset of the electronic design rules but are specific to polishing dummy features. Traditionally, the minimum spacing between a polishing dummy feature and an active feature or another polishing dummy feature is at least five microns and typically is no more than approximately ten microns.

10. Differential exclusion zone is the difference, at the same feature level, between the minimum spacing between a polishing dummy features and an active feature and the minimum spacing between two active features.

To aid in simplicity of the understanding of the ideas disclosed herein, specific, non-limiting examples are described. The examples will first focus on a single feature layer, and then, attention will be directed to the integration of multiple feature layers. A pattern of conductors will be formed from a metal-containing layer that is approximately 0.8 micron thick. An oxide layer of approximately 1.5 microns is subsequently formed over the pattern of conductors and is polished. The focus of the discussion is directed to generating the pattern of conductors and polishing dummy features to aid in the formation of a polished oxide layer having reduced elevation variations.

Figure 2:
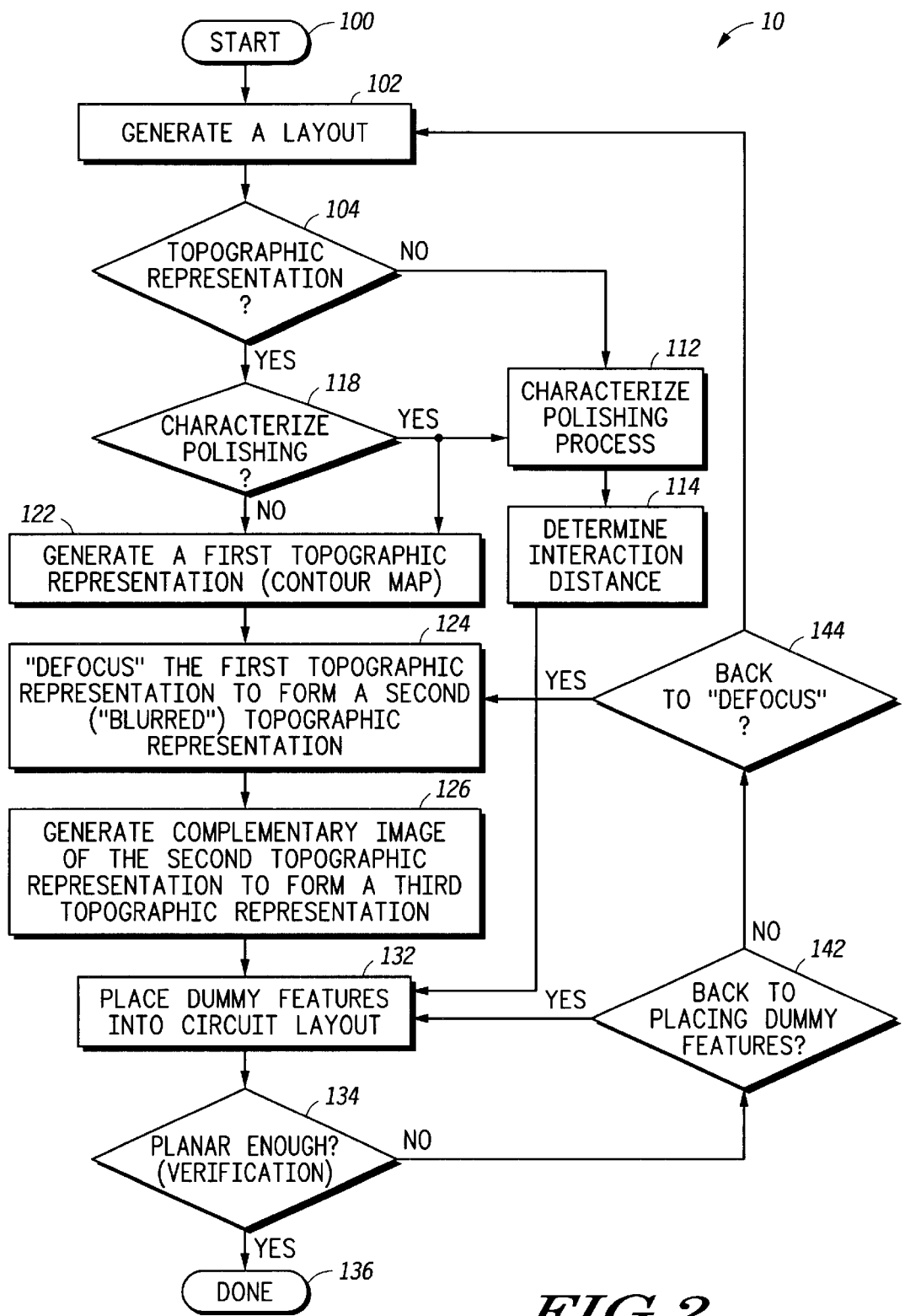
FIG. 2 includes a process flow diagram for an embodiment to determine where polishing dummy features are to be placed within a semiconductor device.

FIG. 2 includes a process flow diagram 10 illustrating a process for determining where polishing dummy features are to be placed into a layout. The process starts (block 100) by generating a layout (block 102). The layout at this point in time typically has active and control features. It does not have any polishing dummy features. The layout is then optionally processed for adjustments to the layout. The smallest geometry features may be resized to account for print or etch bias. Also, the resolution-assist features are typically added. In this specific embodiment, polishing dummy features are not present in the layout at this time. However, polishing dummy features could be present in other embodiments.

Figure 3:
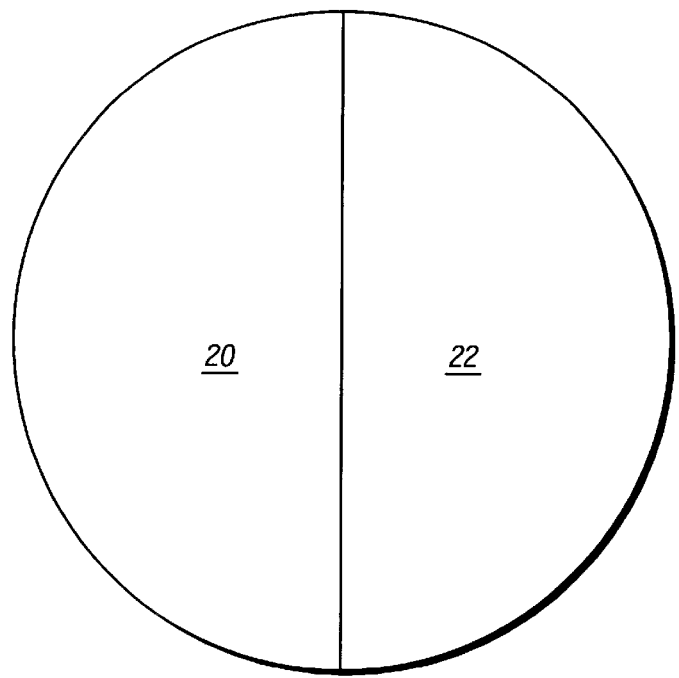
FIG. 3 includes an illustration of a top view of a portion of a semiconductor device substrate and a patterned layer.

In block 104, a decision is made whether a topographic representation is made. If not, the oxide polishing process is characterised in block 112, and an interaction distance is determined in block 114. This characterisation can be performed using test wafers. FIG. 3 includes a top view of a substrate 20 and a layer 22. Because the conductors to be formed are approximately 0.8 microns thick, layer 22 should also be approximately 0.8 microns thick. Typically, the materials used for substrate 20 and layer 22 are not important. Layer 22 could be an insulating layer approximately 0.8 microns thick instead of using a conductive layer. However, if a relatively more compressive layer (e.g., organic low-k dielectric material) underlies the conductors in the finished device, the substrate 20 may need to use the same or a similar material to more accurately characterise the polishing process.

After forming layer 22, it is patterned to simulate an edge similar to the edge of the conductors that are part of the circuit layout. Although half of the wafer is patterned in FIG. 3, other patterns, such as checkerboards, stripes, etc., can be used. The layer to be polished is then formed over the patterned surface. The material and thickness of the layer should be substantially the same as the layer that will be polished on the semiconductor device. In this specific example, the layer includes silicon dioxide and has a thickness of about 1.5 microns. If the layer to be polished includes a plurality of different films or has dopants, the layer for the test wafer should also include the different films or dopants.

The layer 32 is then polished as shown in FIG. 4. The polishing conditions for the test wafer should match the polishing conditions for the semiconductor device substrate as closely as possible. Polishing parameters that can affect the polishing characteristics include stiffness of the polishing pad (hardness of the material(s) and its (their) thickness (es)), down force pressure, polishing fluid composition, platen rotational speed, or the like.

After polishing, the thickness of the layer 32 is relatively constant on both sides far away (approximately 50–100 millimeters (mm)) from the edge of layer 22. There is a transition distance 34 where the elevation of the layer 32 changes. The transition distance 34, which is a polishing characteristic, is typically at least approximately 0.3 mm, and often is at least approximately 1.0 mm. For some oxides that are polished for interlevel dielectric layers or trench field isolation, the transition distance 34 can be in a range of approximately 5–10 mm. The sensitivity of the transition distance 34 when changing polishing parameters is unknown. However, even if the transition distance on product substrates differs by approximately 50%, the test wafer transition width can be used in determining the placement of polishing dummy features.

An interaction distance is determined by a user of the process, but is typically at least half of the transition distance. Polishing dummy features placed within the interaction distance from an active feature should have less impact on polishing and planarization. As one example, the transition distance is approximately six mm. The interaction distance is approximately three mm. If tiling is used, polishing dummy features (tiles) will not need to be place closer than approximately three mm to the nearest active features (e.g., gate electrodes, bit lines, interconnects, etc.) for at least portions of the circuit layout. Typically, the areas of the mask or device having the largest density of active features at a feature level has the lowest need for polishing dummy features. Therefore, polishing dummy features may be placed approximately three mm from the nearest active feature within the densest active feature pattern without significantly affecting polishing of a subsequent layer.

Compare this with conventional methods of tiling where active feature density is not usually taken into account. In those conventional methods, tiles are placed into open areas that are at least 5–10 microns wide and at least 5–10 microns long regardless whether the open area is near the highest active feature density or the lowest active feature density. Therefore, conventional methods typically have polishing dummy features at the edge of a polishing dummy feature pattern that are located no more than 10 microns from the nearest active feature or other dummy features. Note that the interaction distance is slightly less than three orders of magnitude higher than the minimum lateral dimensions used for conventional tiling of open areas. Embodiments of the present invention can have open areas with widths and lengths of at least approximately 50 microns.

Using the interaction distance information, polishing dummy features can be placed into the circuit layout (block 132). At this point, verification (block 134) is typically performed to determine if the resulting surface after the subsequent deposition and polishing will be planar enough. If so, the process is done. Otherwise, the polishing dummy feature pattern within the layout, which now includes active and polishing dummy features, is modified. The process can be iterated until the predicted planarity is acceptable.

Another process can be used in conjunction with or as an alternative to the process previously described. Returning to FIG. 2, topographical representations can be used (block 104). For this example, it will be assumed that the polishing process is not going to be characterised (block 118 following the "NO" path). FIG. 5 includes an illustration of a layout of a semiconductor device 40 having two memory arrays 42 and 44 and a logic region 46. Each of the arrays 42 and 44 and region 46 is at least 50 microns by 50 microns and often is at least 500 microns by 500 microns. The arrays and region can be any shape and are not limited to square or rectilinear shapes. Although the representation would have virtually all the active features (would show virtually all the gate electrodes, word lines, bit lines, interconnects, and the like), a block diagram of the layout is used to simplify understanding.

In this example, the memory arrays 42 and 44 are static random access memory (SRAM) arrays, and the logic region 46 includes a central processing unit, arithmetic logic unit, combinations thereof, or the like. Different types of memory arrays may be used (dynamic random access memory (DRAM) arrays, floating gate memory arrays, ferroelectric random access memory (FERAM) arrays, etc.). Additionally, memory arrays 42 and 44 can be different types of memory arrays. As used in this specification, the area of a memory array is defined by the edges of the outermost memory cells of the memory array and does not include row or column decoders, sense amplifiers, or the like.

Referring to FIG. 5, the memory arrays 42 and 44 and logic region 46 typically lie in a range of approximately 10–100 microns from one another. Although not shown, the memory arrays 42 and 44 can include memory blocks (sub-arrays) that lie at least ten microns apart from other memory block within the same memory array.

Memory arrays 42 and 44 have dense circuitry (closely spaced polycide word lines, metal word lines, and bit lines). Although logic region 46 will have some localized dense circuit regions, its overall circuit density is significantly lower than the circuit density of the memory arrays 42 and 44.

Returning to block 122 in FIG. 2, the first topographic representation is made and can be in a spatial or frequency domain. In the spatial domain, the representation is similar to a contour map, however it shows the relative height difference compared to an average. A program capable of generating this type of representation is Hercules Hierarchical Design Verification software (also known as Hercules Hierarchical Design Rule Check software) made by Avant! Corporation of Fremont, Calif. Again, the real representation will be much more detailed than that shown in FIG. 5. A spatial representation can be converted to the frequency domain, and vice versa, using a Fourier transform function.

In block 124 of FIG. 2, the first topographic representation is then defocused or blurred to form a second topographic representation in FIG. 6. The highest point is a location 52, which is essentially the point between the memory arrays 42 and 44, and the lowest points are points 54, which are areas outside or near the edges of the logic region.

The defocusing or blurring can occur in many different ways. A simple way of defocusing is to obtain a color spatial map of the detailed topography and defocus your eyes. Another way to achieve lower resolution is to generate a transparency of the first representation and place it on an overhead projector. Make sure the image is out of focus to determine generally where the higher and lower points are. Another way to obtain the second topographic representation is to use a frequency domain representation of the first topographic representation and process it through a low pass filter. The low pass filter ignores the microscopic changes (high frequency changes in topography) but keeps the macroscopic changes (low frequency changes in topography). If the frequency domain representation is transformed to the spatial domain, the second representation would look like the illustration in FIG. 6. FIG. 6 includes an illustration of a spatial map after defocusing. Point 52 represents the highest point, and points 54 represent the lowest points.

A complementary image, as illustrated in FIG. 7, is then formed as listed in optional block 126 of FIG. 2. The complementary image is essentially the inverse image of what is shown in FIG. 6. The complementary image in FIG. 7 includes points 64 where polishing dummy features are needed the most, and point 62 where polishing dummy features are needed the least or are to be avoided. The complementary image is a third topographic representation, which can be in the spatial or frequency domain.

At this point, polishing dummy features can be placed into the circuit layout (block 132 in FIG. 2), and the resulting layout is verified to determine if the resulting surface after the subsequent deposition and polishing will be planar enough. If so, the process is done.

Otherwise, the polishing dummy feature pattern within the layout, which now includes active and polishing dummy features, is modified. The modifications can add or remove polishing dummy features or alter their density or shape.

The process can be iterated until the predicted planarity is acceptable. The iteration can go back to different locations. Referring decision block 142 in FIG. 2, the shortest iteration loop returns to placement of polishing dummy features (block 132). In decision block 144, the iteration can go to block 102, where the layout now includes active and polishing dummy features. Alternatively, the layout including active and polishing dummy features can be defocused (block 124).

Figure 8:
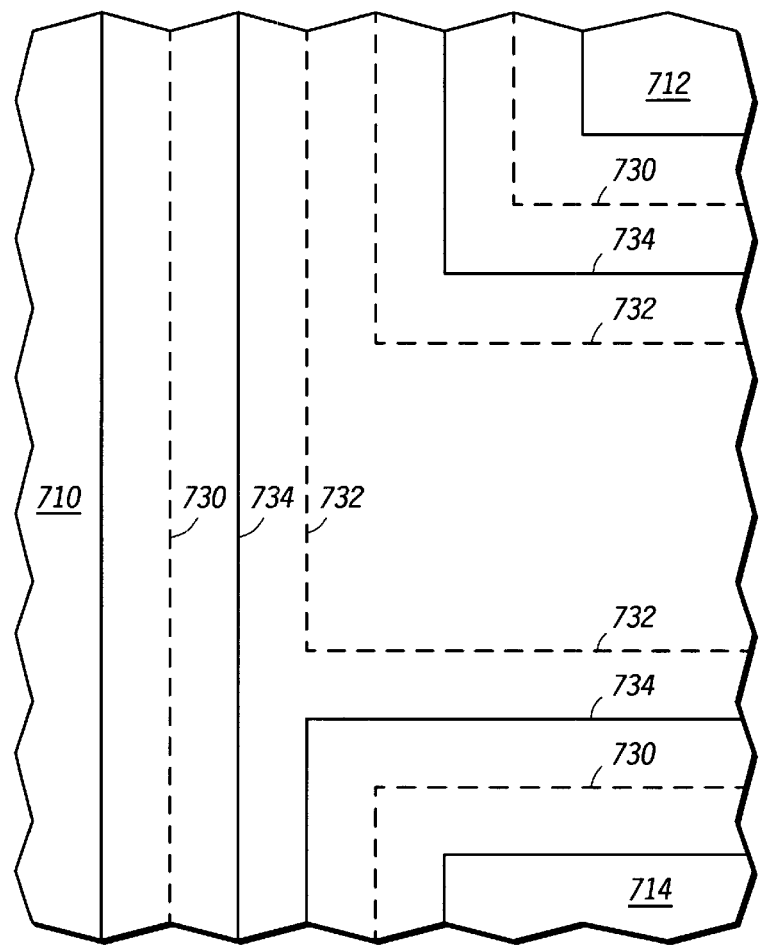
FIG. 8 includes an illustration of a top view of a portion of the semiconductor device layout at a feature level for the semiconductor device of FIG. 5.

Inserting and adjustment of the position of a polishing dummy feature is illustrated in FIG. 8. The amount of area (window) examined as shown in FIG. 8 should be related to the interaction distance, which is one of the polishing characteristics described above. If the area examined is small compared to the interactive distance, an optimal polishing dummy feature pattern may not be achieved. The window can be virtually any shape, although a circular shape or a rectangular (including square) shape is more likely to be used compared to others. The window has a width (diameter or narrower of the two planar directions) is normally at least approximately a tenth of the interaction distance or at least approximately 0.3 mm. In many instances, the window will have a diameter (circular) or each of the width and length (rectilinear) in a range of approximately 0.3–3.0 times the interaction distance or in a range of approximately 1.0–10.0 mm. If the window is less than the entire reticle field, an additional examination should be made where the window is enlarged to include the entire reticle field.

Active features 710, 712, and 714 have been placed into the layout. On the first pass, polishing dummy features are added at all locations except as excluded by the electronic design rules. For this specific embodiment, each polishing dummy feature must lie at least five microns away an active feature. In FIG. 8, a polishing dummy feature is being added at this feature level between active features 710, 712, and 714. Originally, the shape of the polishing is illustrated by dashed line 730. When this polishing dummy feature is inserted into the simulation of the topography, the defocused representation indicates that the elevation for the upper surface of a subsequently formed layer will be too high for the portion of the substrate shown in FIG. 8.

The size of the polishing dummy feature is reduced to the shape illustrated by dashed line 732. This shape of polishing dummy feature replaces the shape corresponding to dashed line 730. Note that the portion of the shape 730 lying between active features 710 and 714 was removed. If this shape is acceptable, it can be used. If the shrinking overcompensated for the adjustment needed, shape 734 may result. A portion of the shape 734 extends between active features 710 and 714. However, that portion may not be necessary, in which case, shape 734 could be an enlarged version of shape 732.

As an alternative process, both the polishing characterisation (blocks 112 and 114) and the topographic representations can be performed (blocks 122, 124, 126). Information from both paths can be used when placing polishing dummy features into the circuit layout (block 132). For example, the topographic representations can be used to determine locations where polishing dummy features, such as tiles, should be placed. The polishing characterisation can be used to determine the minimum distance between the active features and the closest polishing dummy features. In one embodiment, the polishing characterisation is done one time, but the topographic representations and placement of polishing dummy features can be iterated any number of times. After verifying that the placement of the polishing dummy features is proper, a mask can be generated.

Figure 9:
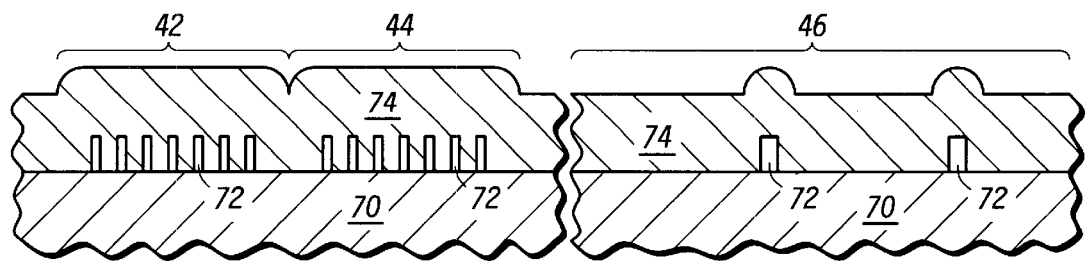
FIG. 9 includes an illustration of a cross-sectional view of a portion of a semiconductor device showing active features and an overlying insulating layer without any polishing dummy features.

FIG. 9 includes an illustration of a portion of a semiconductor device substrate 70 where memory arrays 42 and 44 and logic region 46 (see FIG. 5) are formed. In this example, the substrate 70 includes an insulating layer, and conductors 72 are formed over substrate 70. Within memory arrays 42 and 44, the conductors 72 are bit lines that make electric contact to drain regions of transistors (not shown). Within logic region 46, the conductors are interconnects electrically connected to various components (transistors, capacitors, resistors, etc.).

FIG. 9 shows how the overlying insulating layer 74 has a topography along the upper surface of the insulating layer 74 that varies (no polishing dummy features added). If polishing dummy features are not added and the substrate is polished to planarize the insulating layer 74, the thickness of the insulating layer 74 over the substrate 70 in the memory arrays 42 and 44 will be thicker than the thickness of the insulating layer 74 over the substrate 70 in the logic region 46. Conventional tiling methods would place polishing dummy features (not shown) in open locations having widths in a range of 5–10 microns. One such location lies between memory array 42 and 44.

Figure 10:
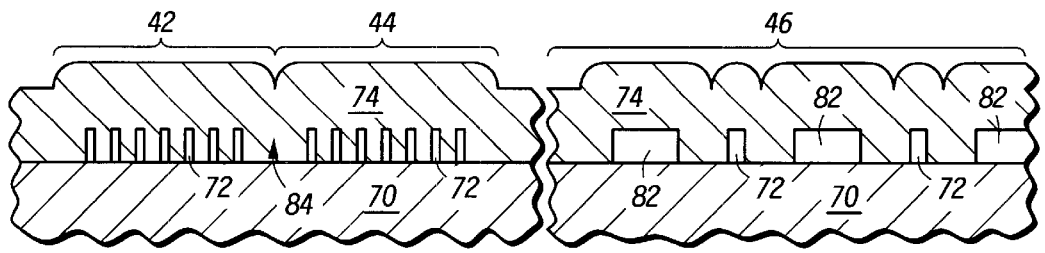
FIG. 10 includes an illustration of a cross-sectional view of a portion of a substrate similar to the one shown in FIG. 9 when polishing dummy features are added to less dense areas.

In accordance with an embodiment of the present invention, polishing dummy features 82 are inserted into the mask at the same feature level as the conductors 72. The resulting pattern is seen in a semiconductor device in FIG. 10. Note that no polishing dummy features are placed in the gap 84 between the memory arrays 42 and 44. The gap is in a range of approximately 20–100 microns wide. Also, similar gaps (not shown) may lie between memory blocks within either or both memory arrays 42 and 44.

Typically, the polishing dummy features 82 are at least approximately 0.3 mm away from the nearest conductor 72 (active feature) within the area having the highest active feature density, and often will be at least 1 mm away. In this specific embodiment, the polishing dummy features 82 closest to the active features within the area having the highest active feature density lie in a range of approximately 3–5 mm away from each other (polishing dummy feature-to-active feature spacing). Again, this is approximately three orders of magnitude higher that what skilled artisans currently use (indiscriminate placement of tiles in all open areas greater than 10 microns). The minimum gaps and spacing for polishing dummy features were determined at least in part from the polishing characterisation previously described.

After the conductors 72 and polishing dummy features 82 are formed over the substrate 70, the insulating layer 74 is formed by depositing one or more insulating films over the conductors 72 and polishing dummy features 82. The average elevation of the upper surface of insulating layer 74 for the left-hand portion of FIG. 10 (arrays 42 and 44) is closer to the average elevation of the upper surface of the insulating layer 74 over the logic region 46.

Figure 11:
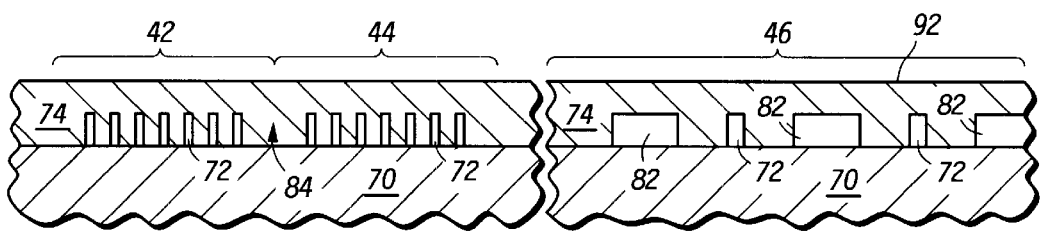
FIG. 11 includes an illustration of a cross-sectional of the substrate of FIG. 10 after polishing the substrate.

After depositing the layer 74, it is then polished to achieve a substantially planar surface 92 as shown in FIG. 11. The conditions used in polishing, should be similar to those used during the characterisation described previously. Therefore, a similar of polishing pad, similar polishing fluid, and similar polishing parameters should be used since these parameters affect the polishing characterisation, which at least in part determined the polishing dummy feature placement. It is not necessary that a perfectly planar surface be the result of the polishing. The amount of undulation should be such that it does not significantly affect the electronic performance (no electrical shorts or leakage paths) or subsequent processing (depth of focus in lithography or etchrelated concerns).

Figure 12:
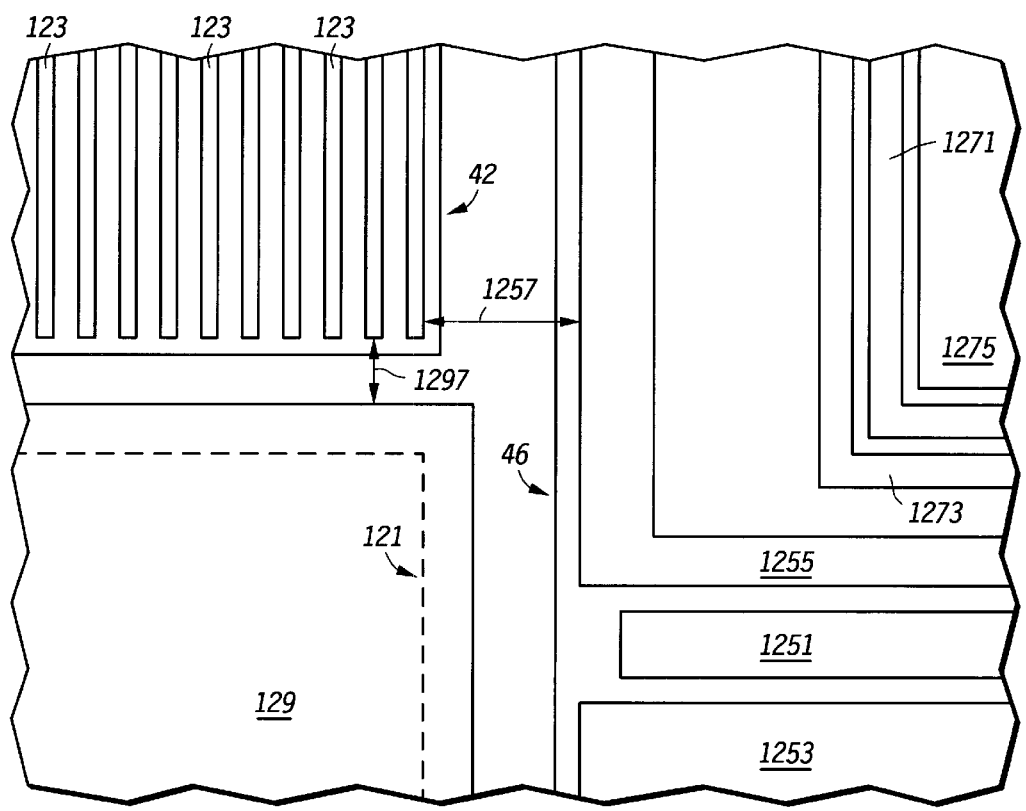
FIG. 12 includes an illustration of a top view of a portion of the semiconductor device at a feature level for the semiconductor device of FIG. 5.

Many other embodiments are possible. FIG. 12 includes an enlarged view of device 40 when SRAM array 44 is replaced by DRAM array 121. The DRAM array 121 has trench capacitors and buried bit lines (bit lines lie within the semiconductor device substrate). The location shown in FIG. 12 is near the borders of SRAM array 42, DRAM array 121, and logic region 46. Although the borders of the arrays and regions are shown in FIG. 12, those borders are for reference and would not show in the mask or semiconductor device being designed or formed. In this embodiment, one level of conductors has active features (bit lines 123 for SRAM array 42) that are dense over SRAM array 42, semi-dense over logic region 46 (a $V_{SS}$ power bus 1251 and a $V_{DD}$ power bus 1271), and non-existent or very low density over DRAM array 121.

Polishing dummy features 129, 1253, 1255, 1273, and 1275 are inserted into the layout. Array 42 has no polishing dummy features shown in FIG. 12. The portion of the semiconductor device having the highest active feature density, such as array 42, has no polishing dummy features. Alternatively, for the area available for polishing dummy features (regions outside the active features and minimum spacing for electronic design rules), those portions with the highest active feature density may have a smaller area occupied by polishing dummy feature(s) compared to lower active feature density areas.

As used in this specification, feature density for a region is the percentage of the region covered by any type of feature compared to the total area in that region not occupied by any features. Put in other terms, the feature density is the percentage of the area in the region occupied feature(s) divided by the total area in the region. The feature density of memory array 121 is the highest because the entire memory array is covered by polishing dummy feature 129. The feature density of logic region 46 is the lowest although, in this embodiment, it does not have any polishing dummy features. The feature density of memory array 42 is between the feature densities of memory arrays 42 and 121. Note that the feature density is not the same for any two of the three different regions of the semiconductor device.

Some items are noted regarding the polishing dummy features in FIG. 12. Polishing dummy features are typically allowed electrically float or are connected to a power supply. In this embodiment, polishing dummy features 129, 1253, and 1255 are coupled or electrically connected to a $V_{SS}$ power supply terminal, and polishing dummy features 1273 and 1275 are coupled or electrically connected to a $V_{DD}$ power supply terminal. Polishing dummy feature 129 may be a grounding plane to help reduce the effects of alpha particles or radiation effects for array 121. Portions of the polishing dummy features 1253 and 1255 and $V_{SS}$ power bus 1251 are one set of decoupling capacitors, and portions of the polishing dummy features 1273 and 1275 and $V_{DD}$ power bus 1271 are another set of decoupling capacitors.

Should a load or signal from other circuitry (not shown) cause potential on the $V_{SS}$ power bus 1251 or $V_{DD}$ power bus 1271 to vary, the other electrodes in the decoupling capacitors (features 1253 and 1255 or features 1273 and 1275) help to reduce the potential drop or decrease the time necessary for the power buses to get closer to their proper potential. Note that the spacing between the buses and its nearest polishing features may be less than the spacing used between the closest active features at that feature (masking) level. For example, the electronic design rules may require a minimum space of approximately 0.5 micron between active features. However, the lithographic limit for the space may be 0.2 micron. The space between the polishing dummy features and their corresponding power busses may be in a range of approximately 0.2–0.4 micron to increase the capacitive coupling.

The polishing dummy feature 129 and bit lines 123 are spaced apart by a distance 1297, and polishing dummy feature 1255 and one of the bit lines 123 are spaced apart by a distance 1257. Each of distances 1297 and 1257 represent the closest points between each of features 129 and 1255 and the bit line(s) 123. Notice that no active or polishing dummy features lie within those spaces. Distance 1297 could be approximately 0.3 mm, and distance 1257 could be approximately 1.0 mm. In other embodiments, those distances could be larger or smaller.

Figure 13:
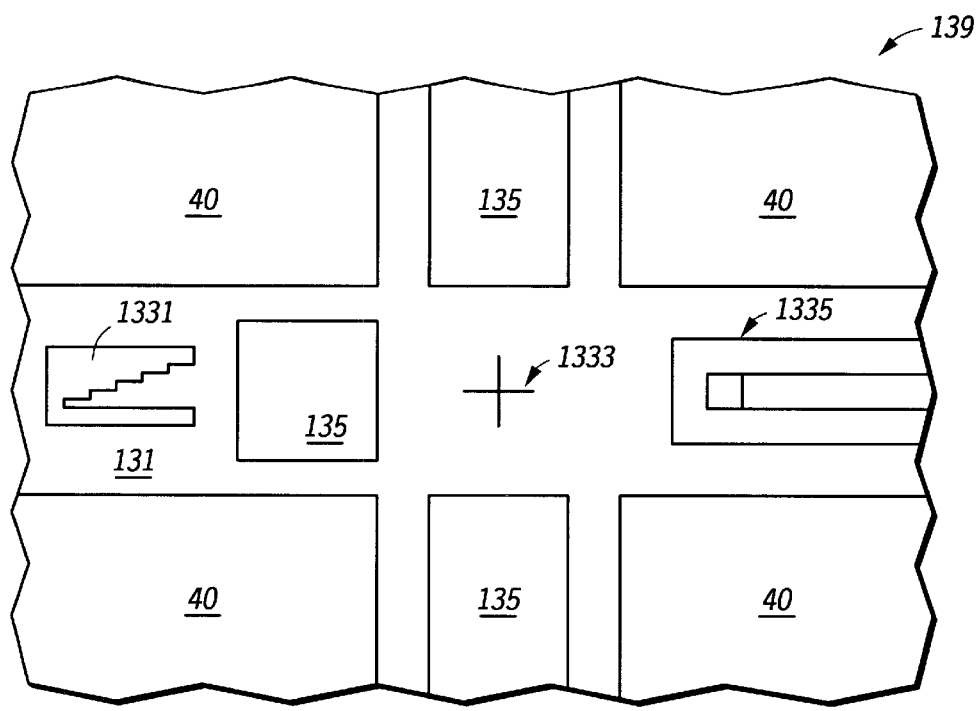
FIG. 13 includes an illustration of a top view of a portion of semiconductor devices near scribe lines and control features within the scribe lines.

Excessive layer erosion due to polishing is typically seen near the edges of a semiconductor device near a scribe line. FIG. 13 includes an illustration of top view of a portion of a semiconductor device substrate 139. The substrate includes four semiconductor devices 40 having integrated circuit areas (memory arrays and logic regions that are not shown). FIG. 13 includes control features, such as the dimension measuring dagger 1331, alignment mark 1333, and electrical test structure (N⁺resistor) 1335 that are located within the scribe lines between the semiconductor devices 40. Other control features (not shown) may be located elsewhere along the scribe lines or even with the semiconductor devices 40. Polishing dummy features 135 are added to the scribe lines to reduce the adverse effects of locally higher polishing rates near the edges of the semiconductor devices 40. In this embodiment, the polishing dummy features 135 may be formed at the same level as the conductors 72 and polishing dummy features 82 in FIG. 10 and overlie the semiconductor device substrate. As will be discussed later, the addition of polishing dummy features within the peripheral areas of semiconductor devices also helps to reduce the amount of erosion.

In still other embodiments, the polishing dummy feature placement can occur at other levels. For example, the polishing dummy feature placement can affect the locations of semiconductor (silicon, silicon-germanium, etc.) mesas formed during a trench field isolation sequence. The pattern of the mesas can be determined at least in part from the polishing characteristics of the subsequently deposited and polished trench fill material (oxide, nitride, silicon, or the like). The processes described above can also be applied to patterns within insulating layers that are formed before depositing and polishing a conductive or metal-containing layer.

Polishing dummy features do not have to be present at every level at which polishing is used. The effect of omitted polishing dummy features accumulates with more layers. Polishing dummy features may be added at only some levels. In one embodiment, the SRAM arrays 42 and 44 in semiconductor device 40 are replaced with DRAM arrays similar to the DRAM array 121 previously described. The semiconductor device still has the logic region 46. A first level of interconnects may form metal word lines for the DRAM arrays and relatively fewer interconnects in logic region 46. A second level of interconnects may form very few, if any, interconnects in the DRAM array (because it has buried bit lines), and a relatively larger number of interconnects in logic region 46. After the second interconnect level is formed and covered by an insulating layer, the upper surface of an insulating layer has average elevations over the DRAM arrays and the logic region 46 that are relatively close to one another (less then 100 nanometer difference between the two areas).

A third level of interconnects are formed that include buses, power rails ($V_{SS}$ and $V_{DD}$), and the like. The density interconnects for the third level may be higher for the DRAM arrays compared to the logic region 46. In this embodiment, polishing dummy features are added only to the third level of interconnects, although polishing dummy features were not used at the first and second level of interconnects.

The increased spacing between the active and polishing dummy features reduces the parasitic capacitive coupling between the two types of features. This reduced capacitive coupling may allow operating a semiconductor device at very high frequencies with less adverse effects.

Figure 14:
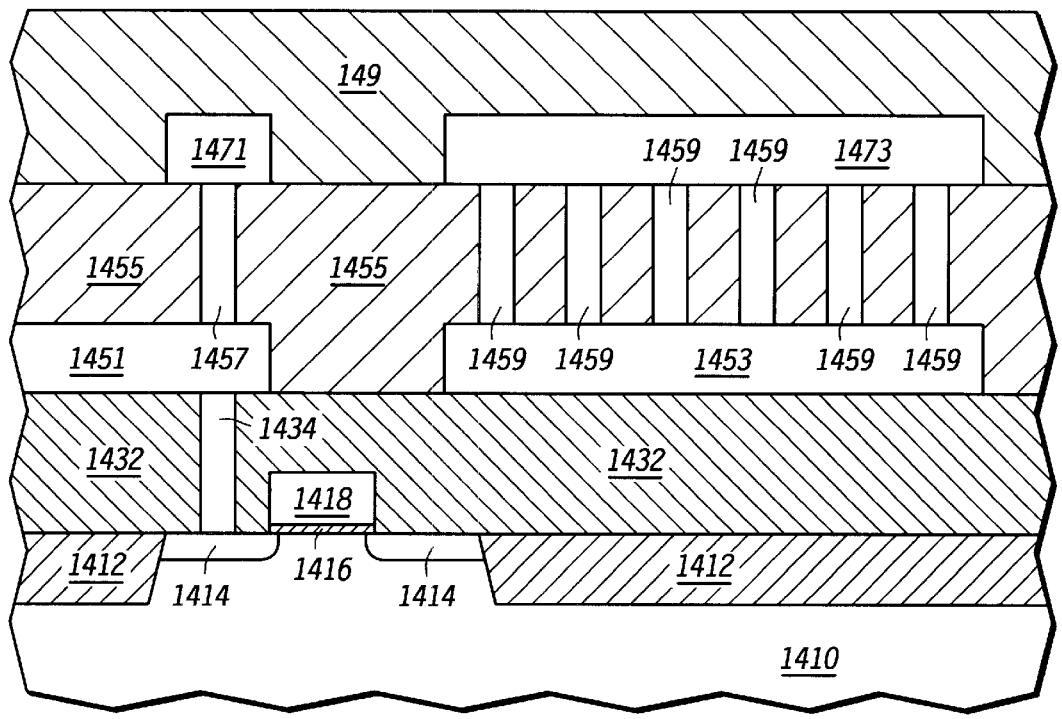
FIG. 14 includes an illustration of a cross-sectional view of a portion of a semiconductor device having polishing dummy features at different feature levels.

In some embodiments, polishing dummy features can touch other polishing dummy features. In FIG. 14, field isolation regions 1412 are formed over portions of a semiconductor device substrate 1410. A gate dielectric layer 1416 and gate electrode 1418 overlie the primary surface of the substrate 1410. Doped regions 1414 are formed within the substrate 1410. A first insulating layer 1432 is formed over the transistor structure and field isolation regions 1412. A conductive plug 1434 is formed to one of the doped regions 1414. An interconnect 1451 is formed over the first insulating layer 1432. Polishing dummy feature 1453 is also formed at the same feature level as the interconnect 1451.

A second insulating layer 1455 is formed over the interconnect 1451 and polishing dummy feature 1453. Conductive plugs 1457 and 1459 are formed. In this embodiment, conductive plug 1457 is an active feature because it is part of an electrical circuit that was designed into the device. Conductive plugs 1459 are polishing dummy features. Note that the conductive plugs 1459 abut the polishing dummy feature 1453. Interconnect 1471 and polishing dummy feature 1473 are then formed over the conductive plugs 1457 and 1459. Polishing dummy feature 1473 abuts the conductive plugs 1459, which are also polishing dummy features. A passivation layer is formed to make a substantially completed semiconductor device.

Polishing processes can be changed to improve the polishing characteristics to reduce the need for inserting polishing dummy features. Stiffer pads, less down force pressure, and higher platen rotational speed may increase the transitional and interaction distances. If the interaction distance is larger than the semiconductor device, a reticle field, or even a substrate, polishing dummy features may not be needed at all.

Figure 15:
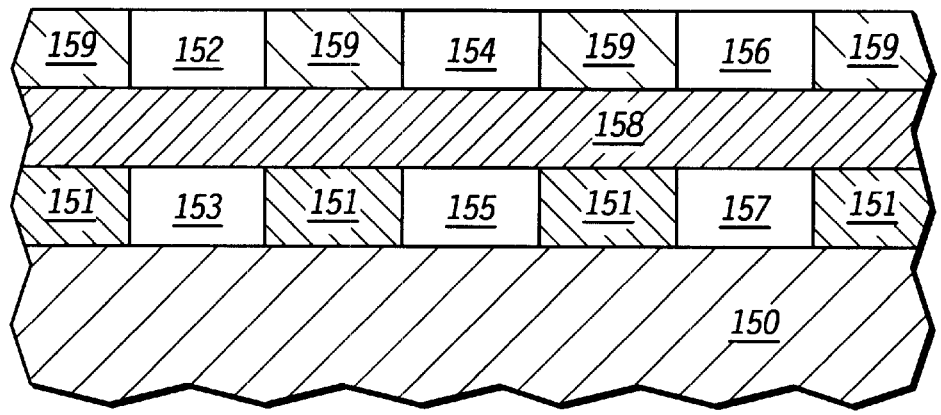
FIGS. 15 and 16 include illustrations of cross-sectional views of portions of substrate showing positional relationships of active features and polishing dummy features at different feature levels.
Figure 16:
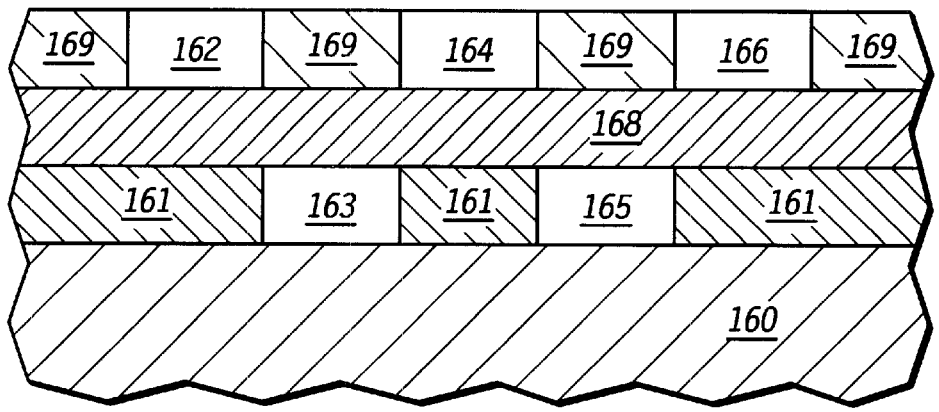

The concepts of the foregoing are extendible to the multiple layers. As can be seen in FIGS. 15 and 16, the placement of polishing dummy features can affect electrical characteristics of active features at other levels. Referring to FIG. 15, conductors 152, 154, and 156 are active features that supply $V_{SS}$, $V_{DD}$, and $V_{PP}$, respectively, within the semiconductor device. Layers 151, 158, and 159 are insulators. A lower feature layer needs polishing dummy features within the area below the conductors 152, 154, and 156. Polishing dummy features 153, 155, and 157 are added below the conductors 152, 154, and 156. Polishing dummy features 153, 155, and 157 are conductive and electrically connected to the $V_{SS}$, $V_{DD}$, and $V_{PP}$ power supply terminals, respectively, to increase capacitive coupling between the polishing dummy features and the power supply conductors. This helps reduce swings in potential when loads are placed on the conductors 152, 154, and 156. Notice that the side edges of the conductors 152, 154, and 156 are coterminous with the side edges of the polishing dummy features 153, 155, and 157. If the conductors 152, 154, and 156 are at about the same potential, a single polishing dummy feature (not shown) may replace the polishing dummy features 152, 154, and 156. The edges of the single polishing dummy feature may be coterminous with the left edge of conductor 152 and the right edge of conductor 156.

Although not shown, the same concept to semiconductor mesas that may or may not lie within and are part of field isolation regions. A polishing dummy feature can be placed above the mesa to form a capacitor to noise within the substrate or well regions within the substrate. If the mesa includes a p-type semiconductor material, the overlying polishing dummy feature is typically coupled or electrically connected to a $V_{SS}$ terminal. For n-type semiconductor material, the overlying polishing dummy feature is typically coupled or electrically connected to $V_{DD}$ terminal. Similar to the power supply conductors, capacitive coupling should be kept high. In this particular instance, the polishing dummy features overlie, rather than underlie features at an adjacent level.

Unlike power supply conductors, capacitive coupling to signal conductors should be minimize or at least reduced. FIG. 16 includes signal conductors 162, 164, and 166, which are active features. Layers 161, 168, and 169 are insulators. Polishing dummy features 163 and 165 are conductive and added at a lower feature level. Notice that the polishing dummy features 163 and 165 are offset from the signal conductors 162, 164, and 166 and underlie portions of the insulating layer 169 lying between the signal features. The offset helps to reduce capacitive coupling that may otherwise affect the speed or integrity (strength) of signals transmitted along conductors 162, 164, and 166. In alternative embodiments, the polishing dummy features shown in FIGS. 15 and 16 could underlie the power supply and signal features, or both overlie and underlie the power sully and signal features. Use of the polishing dummy features will in part depend on planarity requirements at the feature level at which they are to be formed.

Figure 17:
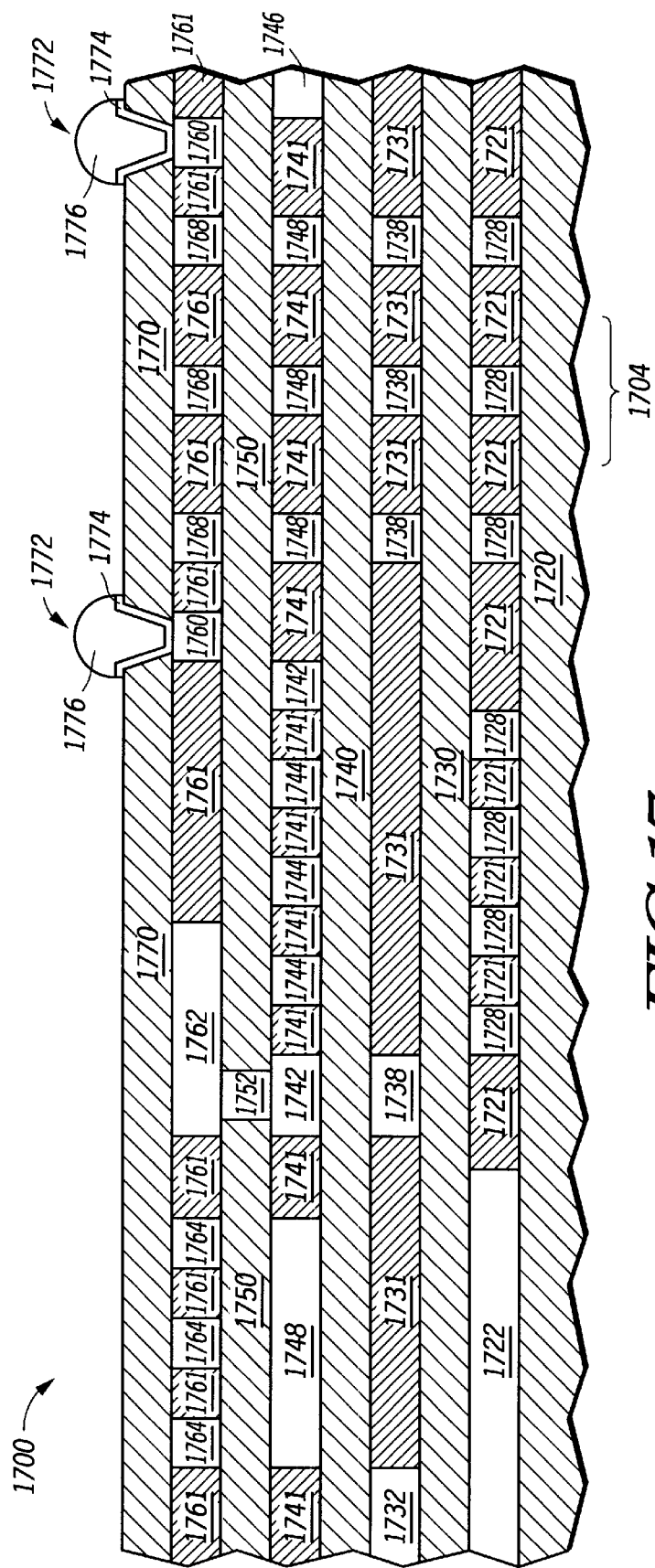
FIG. 17 includes an illustration of a cross-sectional view of a portion of a semiconductor device substrate and positional relationships between conductors and polishing dummy features at different feature levels.

A more global integration is described in conjunction with FIG. 17, which includes a semiconductor substrate 1700 having one semiconductor device, a scribe line 1704, and another semiconductor device along the other side of the scribe line 1704. The figure illustrates how conductive polishing dummy features can be incorporated into an interconnect scheme. Skilled artisans appreciate that the interconnect scheme shown in FIG. 17 is meant to illustrate concepts used in the embodiment. For simplicity, a metal edge seal ring near the scribe line 1704 is not illustrated.

The first portion of the discussion describes what is being formed, the latter portion describes how polishing dummy features are or can be added or removed in relation to other portions of the semiconductor devices. In one embodiment, items illustrated by reference numbers 1720, 1721, 1730, 1731, 1740, 1741, 1750, 1751, 1761, and 1770 are insulators, and items illustrated by reference numbers 1722, 1728, 1732, 1738, 1742, 1744, 1748, 1752, 1760, 1762, 1764, 1768, 1774, and 1776 are conductors.

A first interlevel dielectric (ILD) layer 1720 is formed and patterned to define openings (not shown), and conductive plugs and polishing dummy features (not shown) are formed within the openings. A second ILD layer 1721 is formed and patterned to define openings. An interconnect 1722 and polishing dummy features 1728 are formed within the openings. A third ILD layer 1730 is formed and patterned to define openings (not shown), and conductive plugs and polishing dummy features (not shown) are formed within the openings.

A fourth ILD layer 1731 is formed and patterned to define openings, and interconnect 1732 and polishing dummy features 1738 are formed within the openings. A fifth ILD layer 1740 is formed and patterned to define openings (not shown), and conductive plugs and polishing dummy features (not shown) are formed within the openings. A sixth ILD layer 1741 is formed and pattered to define openings. Dummy bit lines 1742, bit lines 1744, and polishing dummy features 1748 are formed within the openings.

A seventh ILD layer 1750 is formed and patterned to define openings, one of which is in FIG. 17. Conductive plugs, such as conductive plug 1752, and polishing dummy features (not shown) are formed within the openings. An eighth ILD layer 1761 is formed and patterned to define openings. Bond pads 1760, interconnects 1762 and 1764, and polishing dummy features are formed within the openings. A passivation layer 1770 is formed over the uppermost level of interconnects and is patterned to define openings over the bond pads 1760. Conductive bumps 1772 are formed within the openings. The conductive bumps 1772 include an adhesion/barrier layer 1774, and a significantly thicker metal alloy layer 1776.

Skilled artisans appreciates that each of the ILD layers, conductive plugs, local interconnects, interconnects, bond pads, dummy bit lines, polishing dummy features, adhesion/barrier layer, and alloy layer can be formed using one or more different films. ILD layers are typically deposited and include oxide, nitride, or low-k dielectric (dielectric constant no greater than approximately 3.5), and conductors are typically deposited or plated and include refractory metals, their nitrides, aluminum, copper, lead, tin, alloys of any of the foregoing, or the like. For the purposes of this example, the semiconductor devices are formed using a 0.2 micron process technology with 0.5 micron minimum feature width and a 0.5 micron minimum space (1.0 micron pitch) at all conductive plug and interconnect levels. Conventional polishing feature design rules would have a polishing dummy feature exclusion of approximately 5–10 microns.

Attention is now directed to the polishing dummy features and their relationship to other parts of the semiconductor devices and scribe lines. As seen from a top view, the peripheral areas of the semiconductor devices and scribe lines 1704 include many polishing dummy features. Some of the least polishing erosion occurs at and near the scribe lines when no polishing dummy features are placed in the scribe lines because the exposed surface lies at an elevation than the exposed surface within the integrated circuit areas. In conventional processes, polishing dummy features are not formed in the scribe lines or peripheral areas and are only formed within the integrated circuit areas. The polishing dummy features in the scribe lines 1704 help to reduce the adverse effects of different local polishing rates between (1) the integrated circuit areas (especially high feature density areas) and (2) either or both of the peripheral areas and scribe lines. Although polishing dummy features are primarily shown to be formed at interconnect levels in FIG. 17, polishing dummy features can and are formed at all the conductive plug levels, too.

$V_{SS}$ interconnect 1762 is electrically connected to a $V_{SS}$ terminal, and $V_{DD}$ interconnects 1764 are electrically connected to a $V_{DD}$ terminal. The left-most polishing dummy feature 1748 underlies the $V_{DD}$ interconnects 1764 and is electrically connected to a $V_{DD}$ terminal. This increases the capacitive couple between the polishing dummy feature 1748 and the overlying $V_{DD}$ interconnects 1764. If many components connected to the $V_{DD}$ interconnects 1764 are simultaneously accessed, the capacitive coupling between the left-most polishing dummy feature 1748 and the $V_{DD}$ interconnects 1764 reduces the amount of voltage potential variation and decreases the recovery time need to get back to $V_{DD}$ after accessing terminates.

Dummy bit lines 1742 and bit lines 1744 are formed at the same level with polishing dummy features 1748. The dummy bit lines 1742 are electrically connected to a $V_{SS}$ terminal and helps all bit lines 1744 to have more uniform electrical characteristics (bit line accessed is laterally surrounded by two grounded conductors regardless which bit line is accessed). The bit lines 1744 are signal features. Unlike the power supply features 1762 and 1764, capacitive coupling between signal features and polishing dummy features should be kept relatively low. Below the bit lines 1744 is a portion of insulating layer 1731 (near the center of FIG. 17), which is bounded by polishing dummy features 1738. The distance between those polishing dummy features is in a range of approximately 0.1 to 1.0 millimeters.

Using conventional polishing dummy feature design rules, additional polishing dummy features should have been placed within the portion of insulating layer 1731 lying under the bit lines 1744. However, polishing dummy features are not needed because the interaction distance when polishing insulating layer 1731 is in a range of approximately 2.5 to 5.0 millimeters. This is an instance where conventional techniques would use polishing dummy features, but in this embodiment, the polishing dummy features are "removed" (not used).

Near the center of FIG. 17, polishing dummy features 1728 are formed at a location under the bit lines 1744. Notice that each of the polishing dummy features 1728 does not directly underlie any of the bit lines 1744. The polishing dummy features 1728 are offset from the bit lines 1744. This helps to reduce capacitive coupling between bit lines 1744 and the polishing dummy features 1728.

Embodiments described herein have more flexibility in determining the location of polishing dummy features both at the same level and at different feature levels. Conventional polishing dummy feature exclusions may be used for determining the placement of polishing dummy features near signal features, however, the placement of polishing dummy features near power conductors may be as close as the minimum design rule spacing for that feature level, and therefore, polishing dummy features may lie within the differential exclusion zone.

The ideas described herein may be extended to insulators. In general, low-k dielectric materials are relatively softer (more compressible, higher Young's modulus of elasticity) compare to relatively higher dielectric constant materials (dielectric constant higher than 3.5) including silicon dioxide, silicon nitride, refractory metal oxides, and the like. The materials having a relatively higher dielectric constant may be used near features where more capacitive coupling is desired (near power supply features), and low-k dielectric materials near features (signal features) where capacitive coupling is to be reduced.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device comprising:
    a first region at a feature level, wherein:
        the first region includes first active features and first dummy features; and
        the first region has a first feature density; and
    a second region at the feature level, wherein:
        the second region includes second active features and second dummy features; and
        the second region has a second feature density that is different from the first feature density.

2. The semiconductor device of claim 1, wherein:
    the first feature density is at least approximately 1.5 times higher than the second feature density.

3. The semiconductor device of claim 1, wherein:
    the first region lies within a memory array; and
    the second region lies within a logic region.

4. A semiconductor device comprising:
    a first region at a feature level, wherein the first region includes a polishing dummy feature;
    a second region at the feature level, wherein:
        from a top view of the semiconductor device, the second region has an open area of at least 10 microns in length by at least 10 microns in width; and
        the second region does not include a polishing dummy feature.

5. The semiconductor device of claim 4, wherein:
    the second region includes at least a portion of a memory array having a first sub-array and a second sub-array;
    the open area lies between and immediately abuts the first sub-array and the second sub-array; and
    the open area does not include a polishing dummy feature.

6. The semiconductor device of claim 4, wherein:
    the second region includes at least a portion of a first memory array and a second memory array;
    the open area lies between and immediately abuts the first memory array and the second memory array; and
    the open area does not include a polishing dummy feature.

7. The semiconductor device of claim 6, wherein the open area is at least approximately 50 microns wide and at least approximately 50 microns long.

8. The semiconductor device of claim 4, wherein the second region is a memory array that does not include a polishing dummy feature.

9. The semiconductor device of claim 4 wherein the open area is at least approximately 1 mm wide and at least approximately 1 mm long.

10. A semiconductor device comprising:
    a polishing dummy feature at a feature level; and
    an active feature at the feature level that is a closest active feature to the polishing dummy feature, wherein:
        the polishing dummy feature has a point closest to the active feature;
        a distance from the point closest to the active feature is at least approximately 0.3 mm; and
        no other active or polishing dummy feature lies between the closest point and the active feature at the feature level.

11. The semiconductor device of claim 10, wherein the active feature lies within a memory array and the polishing dummy feature lies outside the memory array.

12. The semiconductor device of claim 10, wherein the active feature lies within an integrated circuit area and the polishing dummy feature lies within a peripheral area.

13. A semiconductor device comprising:
    a semiconductor device substrate;
    an integrated circuit area overlying the semiconductor device substrate;
    at least part of a scribe line lying outside the integrated circuit area; and
    at least a portion of a first polishing dummy feature lies within the scribe line and overlies the semiconductor device substrate.

14. The semiconductor device of claim 13, further comprising a second polishing dummy feature, wherein the second polishing dummy feature lies within the peripheral area of the semiconductor device.

15. A semiconductor device comprising:
    an integrated circuit area;
    a scribe line; and
    a peripheral area lying between the integrated circuit area and the scribe line; and
    a polishing dummy feature lying within the peripheral area.

16. The semiconductor device of claim 15, wherein the polishing dummy feature lies outside the integrated circuit area and lies between a bonding pad and the scribe line.

17. A semiconductor device comprising:
    a first active feature; and
    a polishing dummy feature,
    wherein the semiconductor device has a configuration selected from a group consisting of:
        (a) the first active feature and polishing feature lie at a same feature level;

the first active feature is a power supply feature; and
the first active feature lies within approximately 1.0 micron of the polishing dummy feature;
(b) the first active feature and polishing feature lie at different feature levels;
the first active feature is a power supply feature; and
the first active feature overlies or underlies the polishing dummy feature;
(c) the first active feature and polishing feature lie at a same feature level;
the first active feature is a signal feature; and
the first active feature lies at least approximately 0.3 millimeters from the polishing dummy feature; and
(d) the first active feature and polishing feature lie at different feature levels;
the first active feature is a signal feature; and
the first active feature does not overlie or underlie the polishing dummy feature.

18. The semiconductor device of claim 17, wherein:
the semiconductor device has configuration (a) or (b);
the first active feature is designed to operate at a potential; and
the polishing dummy feature is designed to operate at substantially the potential.

19. The semiconductor device of claim 18, wherein the potential is selected from a group consisting Of $V_{SS}$, $V_{DD}$, and $V_{PP}$.

20. The semiconductor device of claim 17, wherein:
the semiconductor device has configuration (b);
each of the first active feature and the polishing dummy feature has a pair of opposing sides; and
at a location within the semiconductor device, the opposing sides of the first active feature are coterminous with the opposing sides of the polishing dummy feature.

21. The semiconductor device of claim 17, further comprising a second active feature at a same feature level as the first active feature, wherein:
the semiconductor device has configuration (d); and
at a location within the semiconductor device:
a gap lie between the first and second active features and no active features lie within the gap;
the dummy polishing feature underlies or overlies the gap; and the polishing dummy feature does not underlie or overlie the first active feature and the second active feature.

22. A semiconductor device comprising:
a first polishing dummy feature at a first feature level; and
a second polishing dummy feature at a second feature level, which lies at an elevation different from the first feature level, wherein the second polishing dummy feature immediately abuts the first polishing dummy feature.

23. The semiconductor device of claim 22, wherein:
the semiconductor device further includes active features and third polishing dummy features at the second feature level;
each of the third polishing dummy features is similar to the second polishing dummy feature;
the second and third polishing dummy features contact the first polishing dummy feature; and
the active features at the second feature level are conductive plugs.

* * * * *